(12) United States Patent
Park et al.

(10) Patent No.: US 12,133,015 B2
(45) Date of Patent: Oct. 29, 2024

(54) ARRAY SUBSTRATE FOR DIGITAL X-RAY DETECTOR, AND DIGITAL X-RAY DETECTOR INCLUDING THE SAME

(71) Applicant: LG DISPLAY CO., LTD., Seoul (KR)

(72) Inventors: Shihyung Park, Daegu (KR); Moonsoo Kang, Daegu (KR); Jaeho Yoon, Gyeongsangbuk-do (KR); Donghyeon Jang, Jinju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 297 days.

(21) Appl. No.: 17/542,574

(22) Filed: Dec. 6, 2021

(65) Prior Publication Data

US 2022/0210345 A1 Jun. 30, 2022

(30) Foreign Application Priority Data

Dec. 24, 2020 (KR) .................. 10-2020-0183757

(51) Int. Cl.
*H04N 5/32* (2023.01)
*H01L 27/146* (2006.01)

(52) U.S. Cl.
CPC ........... *H04N 5/32* (2013.01); *H01L 27/1461* (2013.01); *H01L 27/14614* (2013.01); *H01L 27/14658* (2013.01)

(58) Field of Classification Search
None
See application file for complete search history.

(56) References Cited

U.S. PATENT DOCUMENTS

| 6,636,279 B2 | 10/2003 | Takasugi et al. |
| 9,711,098 B2 | 7/2017 | Park et al. |
| 10,186,567 B2 | 1/2019 | Jeong et al. |

(Continued)

FOREIGN PATENT DOCUMENTS

| CN | 1334550 A | 2/2002 |
| CN | 106980214 A | 7/2017 |

(Continued)

OTHER PUBLICATIONS

Korean Office Action dated Jan. 24, 2024 issued in Patent Application No. 10-2020-0183757 w/English Translation (13 pages).

(Continued)

*Primary Examiner* — Edwin C Gunberg
(74) *Attorney, Agent, or Firm* — POLSINELLI PC

(57) ABSTRACT

A digital X-ray detector includes a width of a data line or a gate line extending across a dummy pixel area is smaller than a width of the data line or the gate line extending across an active area, a width of a dummy gate line or a dummy data line extending across the dummy pixel area is smaller than a width of the gate line or the data line extending across the active area, so that static electricity generated during a manufacturing process does not randomly flow into the active area, but rather flows into the dummy pixel area having the lowest capacitance, and the static electricity may be guided not to the active area but to the dummy gate line or dummy data line in the dummy pixel area, thereby minimizing line defects or block luminance deviation defects caused by the static electricity generated during the manufacturing process.

25 Claims, 10 Drawing Sheets

(56) References Cited

U.S. PATENT DOCUMENTS

| | | | |
|---|---|---|---|
| 10,222,656 B2 | 3/2019 | Kim et al. | |
| 10,670,930 B2 | 6/2020 | Jeong et al. | |
| 2006/0170794 A1* | 8/2006 | Higuchi | H04N 25/65 |
| | | | 348/241 |
| 2006/0221288 A1* | 10/2006 | Ota | G02F 1/136204 |
| | | | 349/143 |
| 2013/0148049 A1 | 6/2013 | Abe et al. | |
| 2015/0001415 A1* | 1/2015 | Fei | G01T 1/17 |
| | | | 361/220 |
| 2016/0071884 A1 | 3/2016 | Miyamoto et al. | |

FOREIGN PATENT DOCUMENTS

| | | |
|---|---|---|
| CN | 108121119 A | 6/2018 |
| CN | 108766327 A | 11/2018 |
| JP | H1152427 A | 2/1999 |
| JP | 2006-276590 A | 10/2006 |
| KR | 10-2016-0046152 A | 4/2016 |
| KR | 10-2016-0066642 A | 6/2016 |
| KR | 10-2019-0048118 A | 5/2019 |
| KR | 10-2020-0082122 A | 7/2020 |

OTHER PUBLICATIONS

Chinese Office Action dated Apr. 12, 2024 issued in Patent Application No. 202111527826.X w/English Translation (10 pages).

* cited by examiner

ARRAY SUBSTRATE FOR DIGITAL X-RAY DETECTOR, AND DIGITAL X-RAY DETECTOR INCLUDING THE SAME

CROSS-REFERENCE TO RELATED APPLICATION

This application claims the priority of Korean Patent Application No. 10-2020-0183757 filed on Dec. 24, 2020, which is hereby incorporated by reference in its entirety.

BACKGROUND

Field of the Disclosure

The present disclosure relates to an array substrate for a digital X-ray detector which may minimize defects as caused by static electricity inflow, and a digital X-ray detector including the same.

Description of the Background

Because X-ray is of a short wavelength, the X-ray may transmit through an object easily. The transmittance of an X-ray depends on an inner density of the object. Therefore, an internal structure of the object may be observed by detecting the transmittance of the X-ray as transmitted through the object.

One of X-ray based inspection methods used in a medical field is a film printing scheme. However, in the film printing scheme, in order to check a result, an image is shot, and then a film is printed. Thus, it takes a long time to check the result. Especially, in the film printing scheme, there are many difficulties in storing and preserving the printed film.

Recently, a digital X-ray detector (DXD) using a thin-film transistor has been developed and widely used in a medical field.

The digital X-ray detector detects the transmittance of the X-ray transmitted through the object and displays an internal state of the object on a display based on the transmittance.

Therefore, the digital X-ray detector may display the internal structure of the object without using a separate film and a printed paper. Further, the DXD has an advantage that the result may be checked in real time immediately after X-ray photographing.

SUMMARY

The digital X-ray detector includes a scintillator that converts X-rays into visible light, and a plurality of photo-sensitive pixels that convert the converted visible light into electrical detection signals.

The photo-sensitive pixel includes various elements such as PIN (P-type/I-type/N-type semiconductors) diodes and thin-film transistors. The PIN diode is sensitive to light.

Therefore, the digital X-ray detector including the PIN diode responds to exceedingly small light and displays a signal.

Specifically, electrons, that is, signals generated from the PIN diode extend across the thin-film transistor and then through a data line and then are applied to a readout circuitry.

Further, a large amount of static electricity may be generated during a process of manufacturing the digital X-ray detector. Due to such static electricity, a short circuit between a gate line and the data line may frequently occur.

When the gate line and the data line are short-circuited with each other, electrons of the gate line are partially leaked to the data line, so that an amount of electrons higher than an amount allowable in the readout circuitry may be applied to the readout circuitry.

In this way, a voltage higher than a voltage allowable in the readout circuitry is applied to the readout circuitry, such that data line defects, or inter-block luminance deviation defects (block dim) may occur in a corresponding line, that is, the data line.

Further, electrons of the data line may partially leak to the gate line. In this case, the gate line defects may occur.

A digital X-ray detector panel where the line defect or the block luminance deviation defect occurs is determined to be defective. Thus, a process yield is drastically lowered due to the defect.

In particular, the static electricity is concentrated on a portion of the digital X-ray detector panel where the gate line and the data line overlap each other with the smallest area, that is, a portion thereof where a capacitance between the two lines is the lowest. Thus, the static electricity concentration may occur not in a specific pixel but randomly within the panel.

Accordingly, the inventors of the present disclosure have invented an array substrate for a digital X-ray detector that may minimize defects due to the inflow of static electricity, and a digital X-ray detector including the same.

A purpose according to one aspect of the present disclosure is to provide an array substrate for a digital X-ray detector that may minimize random generation of the static electricity in an active area, and a digital X-ray detector including the same.

Another purpose according to one aspect of the present disclosure is to provide an array substrate for a digital X-ray detector which may minimize an effect of the static electricity on an operation of the detector even when the static electricity is generated during a manufacturing process, and a digital X-ray detector including the same.

Still another purpose according to one aspect of the present disclosure is to provide an array substrate for a digital X-ray detector that may minimize line defects or block luminance deviation defects caused by the static electricity generated during a manufacturing process, and a digital X-ray detector including the same.

Purposes in accordance with the present disclosure are not limited to the above-mentioned purpose. Other purposes and advantages in accordance with the present disclosure as not mentioned above may be understood from following descriptions and more clearly understood from aspects in accordance with the present disclosure. Further, it will be readily appreciated that the purposes and advantages in accordance with the present disclosure may be realized by features and combinations thereof as disclosed in the claims.

An array substrate for a digital X-ray detector according to a first aspect of the present disclosure includes an active area including a plurality of pixel areas defined by intersections between a plurality of gate lines and a plurality of data lines arranged in a matrix form having a plurality of rows and a plurality of columns; and first and second dummy pixel areas, wherein the first dummy pixel area extends on and along one side of the active area, while the second dummy pixel area extends on and along the opposite side of the active area, wherein a first dummy gate line extends along the first dummy pixel area, and a second dummy gate line extends along the second dummy pixel area.

In this connection, each data line extends across the active area, the first dummy pixel area, and the second dummy pixel area, wherein a width of each data line in each of the first and second dummy pixel areas is smaller than a width of each data line in the active area, wherein each of the first and second dummy gate lines may extend in a manner parallel to an extension direction of each gate line, wherein a width of each of the first and second dummy gate lines is smaller than a width of each gate line.

According to a second aspect of the present disclosure, each dummy gate line is branched into a plurality of dummy gate branch lines in an area in which each dummy gate line intersects each data line, wherein a width of each dummy gate branch line is smaller than a width of each dummy gate line.

According to the third aspect of the present disclosure, each data line is branched into a plurality of data branch lines in an area in which each data line intersects each dummy gate line, wherein widths of the plurality of data branch lines are different from each other.

An array substrate for a digital X-ray detector according to a fourth aspect of the present disclosure includes an active area including a plurality of pixel areas defined by intersections between a plurality of gate lines and a plurality of data lines arranged in a matrix form having a plurality of rows and a plurality of columns; and first and second dummy pixel areas, wherein the first dummy pixel area extends on and along one side of the active area, while the second dummy pixel area extends on and along the opposite side of the active area, wherein a first dummy data line extends along the first dummy pixel area, and a second dummy data line extends along the second dummy pixel area.

In this connection, each gate line extends across the active area and each dummy pixel area, wherein a width of each gate line in each dummy pixel area is smaller than a width of each gate line in the active area, wherein each dummy data line may extend in a manner parallel to an extension direction of each data line, wherein a width of each dummy data line is smaller than a width of each data line.

According to a fifth aspect of the present disclosure, each dummy data line is branched into a plurality of dummy data branch lines in an area in which each dummy data line intersects each gate line, wherein a width of each dummy data branch line is smaller than a width of each dummy data line.

According to a sixth aspect of the present disclosure, each gate line is branched into a plurality of gate branch lines in an area in which each gate line intersects each dummy data line, wherein widths of the plurality of gate branch lines are different from each other.

A digital X-ray detector according to an aspect of the present disclosure includes the array substrate for the digital X-ray detector according to each of the first to sixth aspects as described above, and a scintillator layer disposed on the array substrate and in the active area.

According to various aspects as described above, the static electricity may be guided to flow not into the active area but into the dummy pixel area irrelevant to the operation of the array substrate, thereby defects in the digital X-ray detector may be minimized.

According to the aspects of the present disclosure, the width of the data line or the gate line extending across the dummy pixel area may be smaller than the width of the data line or the gate line extending across the active area. Further, the width of the dummy gate line or the dummy data line extending across the dummy pixel area may be smaller than the width of the gate line or the data line extending across the active area. Thus, the static electricity generated during the manufacturing process does not randomly flow into the active area, but rather flows into the dummy pixel area having the lowest capacitance.

Further, according to the aspect of the present disclosure, branching the dummy gate line into the plurality of dummy gate branch lines having the narrower width as an area with the low capacitance or branching the dummy data line into the plurality of dummy data branch lines having the narrower width as an area with the low capacitance may allow the static electricity to flow into the dummy branch lines having the lower capacitance.

In this case, even when the dummy gate branch line or the dummy data branch line is short-circuited with the data line or gate line due to the introduced static electricity, an effect of the static electricity on the operation of the digital X-ray detector may be minimized because the short-circuit occurs in the dummy line.

Further, according to the aspect of the present disclosure, branching the data line or the gate line into the plurality of data branch lines having different widths or the plurality of gate branch lines having different widths as an area having the lower capacitance may allow the static electricity to flow into the relatively narrower data branch line or gate branch line.

In this case, even when burn occurs in the narrower data branch line or gate branch line due to the introduced static electricity, and thus the electrical conductivity thereof is lowered, the effect of the static electricity on the operation of the digital X-ray detector may be minimized because a signal may normally move to the relatively wider data branch line or gate branch line.

Further, according to the aspects of the present disclosure, the static electricity may be guided not to the active area but to the dummy gate line or dummy data line in the dummy pixel area. Thus, even when the static electricity is guided to the gate line and the data line, the effect of the static electricity on the operation of the digital X-ray detector may be minimized. This may minimize the line defects or block luminance deviation defects caused by the static electricity generated during the manufacturing process.

In addition to the effects as described above, specific effects in accordance with the present disclosure will be described together with following detailed descriptions for carrying out the disclosure.

BRIEF DESCRIPTION OF DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTIONS

Figure 1:
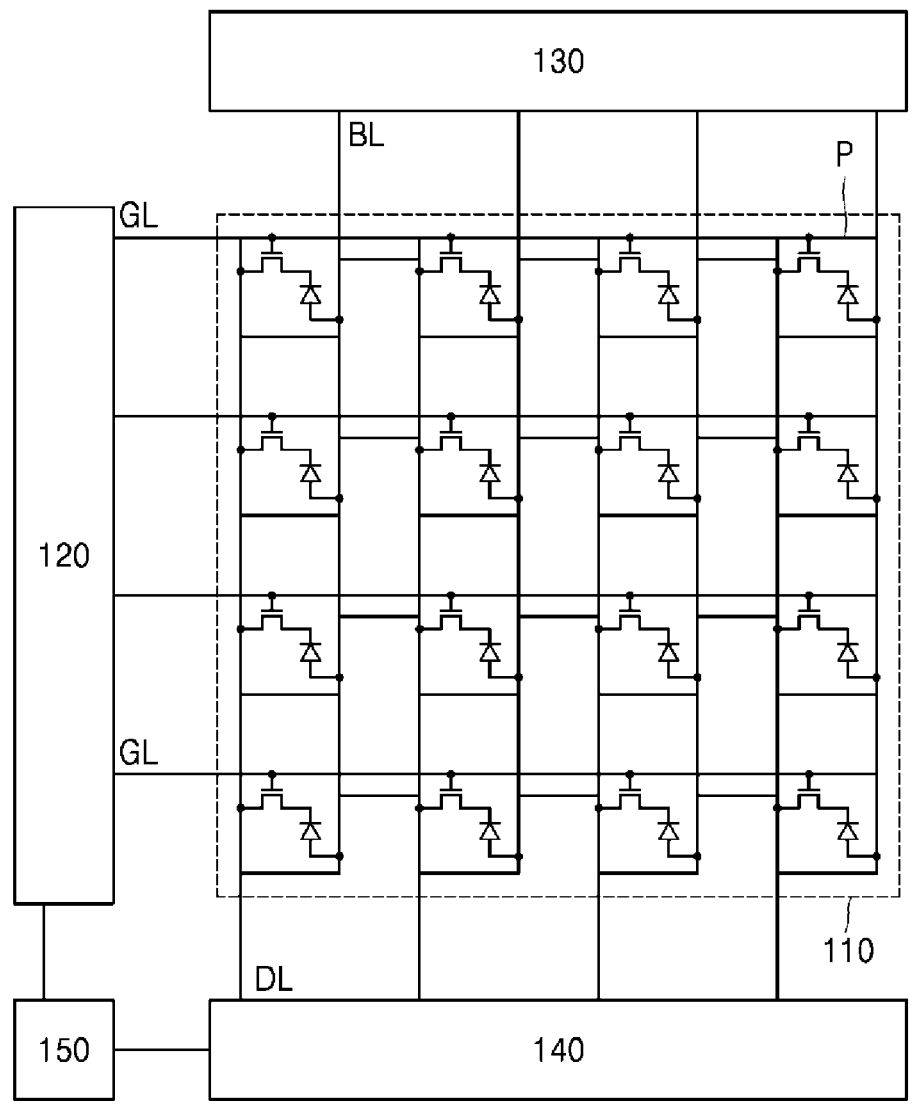
FIG. 1 is a block diagram for schematically illustrating a digital X-ray detector.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims. A shape, a size, a ratio, an angle, a number, etc. disclosed in the drawings for describing aspects of the present disclosure are exemplary, and the present disclosure is not limited thereto. The same reference numerals refer to the same elements herein.

The terminology used herein is for the purpose of describing particular aspects only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified. It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on top" of another layer, film, region, plate, or the like, the former may directly contact the latter or still another layer, film, region, plate, or the like may be disposed between the former and the latter. As used herein, when a layer, film, region, plate, or the like is directly disposed "on" or "on top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain aspect may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is indicated. The features of the various aspects of the present disclosure may be partially or entirely combined with each other, and may be technically associated with each other or operate with each other. The aspects may be implemented independently of each other and may be implemented together in an association relationship. Spatially relative terms, such as "beneath" "below" "lower" "under" "above" "upper" and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the figures is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly. "X axis direction", "Y axis direction" and "Z axis direction" should not be interpreted only to have a geometric relationship in which the X axis direction, the Y axis direction, and the Z axis direction are perpendicular to each other. "X axis direction", "Y axis direction" and "Z axis direction" may be interpreted to have a broader direction within a range in which components herein may work functionally.

Hereinafter, an array substrate for a digital X-ray detector which may minimize defects as caused by static electricity inflow, and a digital X-ray detector including the same according to some aspects of the present disclosure will be described with reference to the drawings.

FIG. 1 is a block diagram for schematically illustrating the digital X-ray detector. The digital X-ray detector may include a thin-film transistor array 110, a gate driver 120, a bias supply 130, a readout circuitry 140, and a timing controller 150.

The thin-film transistor array 110 includes a plurality of cell regions defined by a plurality of gate lines GL arranged in a first direction and by a plurality of data lines DL arranged in a second direction orthogonal to the first direction.

The cell regions are arranged in a matrix form having a plurality of rows and a plurality of columns. In each cell region, photo-sensitive pixels P may be formed. The thin-film transistor array 110 detects the X-ray emitted from an X-ray source and converts the detected X-ray into an electrical signal and outputs the electrical signal.

Each photo-sensitive pixel includes a PIN diode which converts light in a visible light range converted from the X-ray by a scintillator into an electrical signal and outputs the electrical signal, and a thin-film transistor TFT which transmits a detected signal output from the PIN diode to the readout circuitry 140. One end of the PIN diode may be connected to the thin-film transistor and the other end thereof may be connected to a bias line BL.

A gate electrode of the thin-film transistor may be connected to the gate line GL which carries a scan signal. Source/drain electrodes of the thin-film transistor may be respectively connected to the PIN diode and a data line DL which carries the detected signal output from the PIN diode. Each bias line BL may extend in a manner parallel to each data line DL.

The gate driver 120 may sequentially apply gate signals to thin-film transistors of photo-sensitive pixels through the gate lines GL. The thin-film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 140 may read out the detected signal transmitted from the thin-film transistor turned on in response to the gate signal of the gate driver. That is, the detected signal output from the PIN diode may be input to the readout circuitry 140 through the thin-film transistor and the data line DL.

The readout circuitry 140 may read out the detected signal output from each of the photo-sensitive pixels during an offset readout period for reading out an offset image and an X-ray readout period for reading out the detected signal after an X-ray exposure.

The readout circuitry 140 may include a signal detector and a multiplexer. The signal detector includes a plurality of amplification circuits that respectively correspond to the data lines DL. Each amplification circuit may include an amplifier, a capacitor, and a reset element.

The timing controller 150 may generate an initiation signal and a clock signal and supply the initiation signal and the clock signal to the gate driver 120 to control an operation of the gate driver 120. Further, the timing controller 150 may generate a readout control signal and a readout clock signal, and may supply the readout control signal and the readout clock signal to the readout circuitry 140 to control an operation of the readout circuitry 140.

Figure 2:
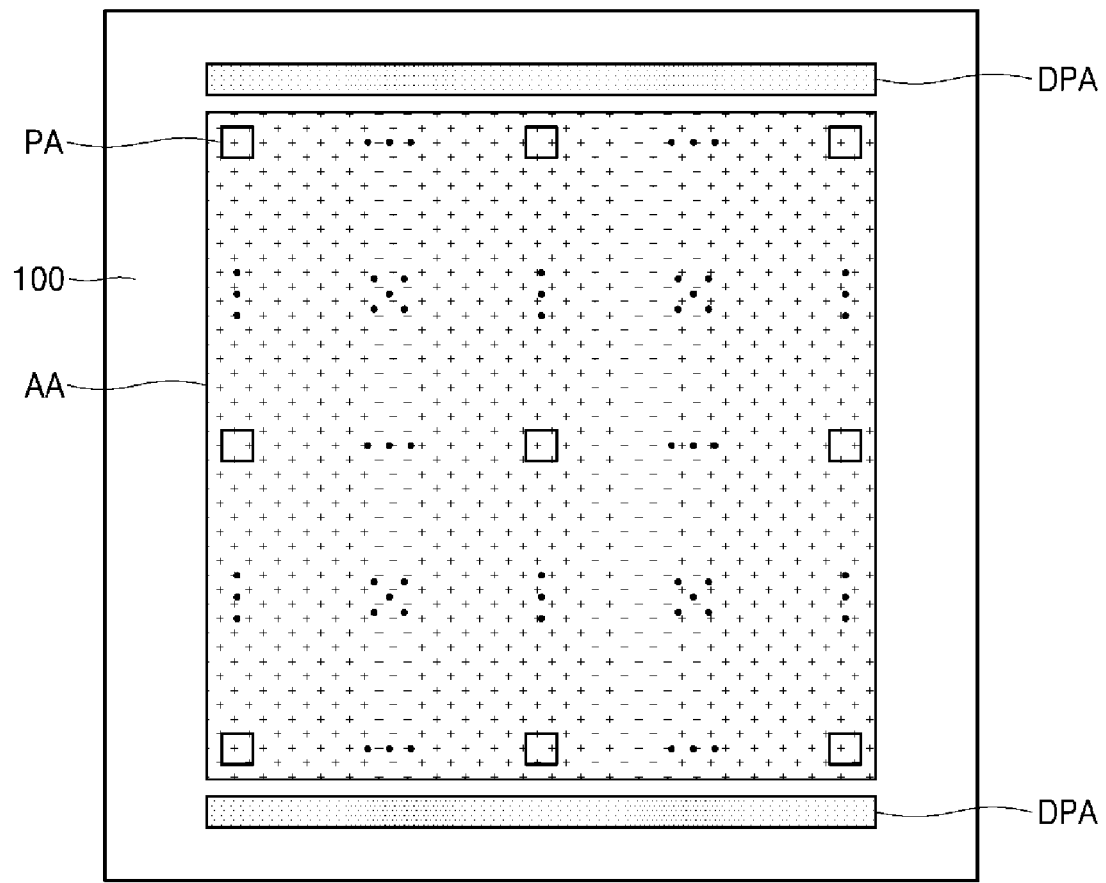
FIG. 2 is a schematic arrangement diagram of an active area and dummy pixel areas of an array substrate for a digital X-ray detector and a digital X-ray detector including the same according to a first aspect to a third aspect of the present disclosure.

FIG. 2 is a schematic arrangement diagram of an active area AA and dummy pixel areas DPA of an array substrate 100 for a digital X-ray detector, and a digital X-ray detector including the same according to a first aspect to a third aspect of the present disclosure.

The digital X-ray detector detects X-rays emitted from the X-ray source, converts the detected X-rays in a photo-electrical manner, and outputs an electrical detection signal.

To this end, the digital X-ray detector includes a scintillator that converts X-ray to light in a visible light range, and a plurality of photo-sensitive pixels P that convert the converted light in the visible light range into the electrical detection signal. The photo-sensitive pixels P may be arranged in a matrix form having a plurality of rows and a plurality of columns.

Specifically, each photo-sensitive pixel P may include a PIN diode 230 (shown in FIGS. 3-5, for example) which converts the light in the visible light range converted from the X-ray via the scintillator into an electrical detection signal and outputs the signal, and a thin-film transistor 220 (shown in FIGS. 3-5, for example) that transmits the detection signal received from the PIN diode 230 to the readout circuitry 140.

Accordingly, as the photo-sensitive pixels P are arranged in a matrix form having a plurality of rows and a plurality of columns, the PIN diodes 230 and the thin-film transistors 220 respectively included in the photo-sensitive pixels P may be arranged in a matrix form having a plurality of rows and a plurality of columns.

As shown in FIG. 2, the array substrate 100 for the digital X-ray detector according to one aspect of the present disclosure may include the active area AA including the plurality of pixel areas defined by intersections between a plurality of gate lines and a plurality of data lines arranged in a matrix form having a plurality of rows and a plurality of columns; and first and second dummy pixel areas DPA, wherein the first dummy pixel area extends on and along one side of the active area, while the second dummy pixel area extends on and along the opposite side of the active area.

The array substrate 100 for a digital X-ray detector includes the active area AA and a non-active area around the active area AA.

The active area AA includes a plurality of pixel areas PA.

In the non-active area, pad-related components such as the gate driver 120 and the readout circuitry 140 connected to the photo-sensitive pixels P in the pixel area PA may be disposed.

Further, the dummy pixel area DPA may be disposed in the non-active area. As in one aspect of the present disclosure, each dummy pixel area DPA may extend along and on each of one side and the opposite side of the active area AA, specifically, a top side and a bottom side of the active area AA.

The dummy pixel area DPA refers to a dummy area that has a pattern similar to that of one row of the pixel areas PA, but does not substantially contribute to the operation of the digital X-ray detector.

The first aspect to the third aspect as described below may have the same arrangement of the active area AA and the dummy pixel areas DPA. The first aspect to the third aspect will be described in detail with reference to FIGS. 3 to 5.

Figure 3:
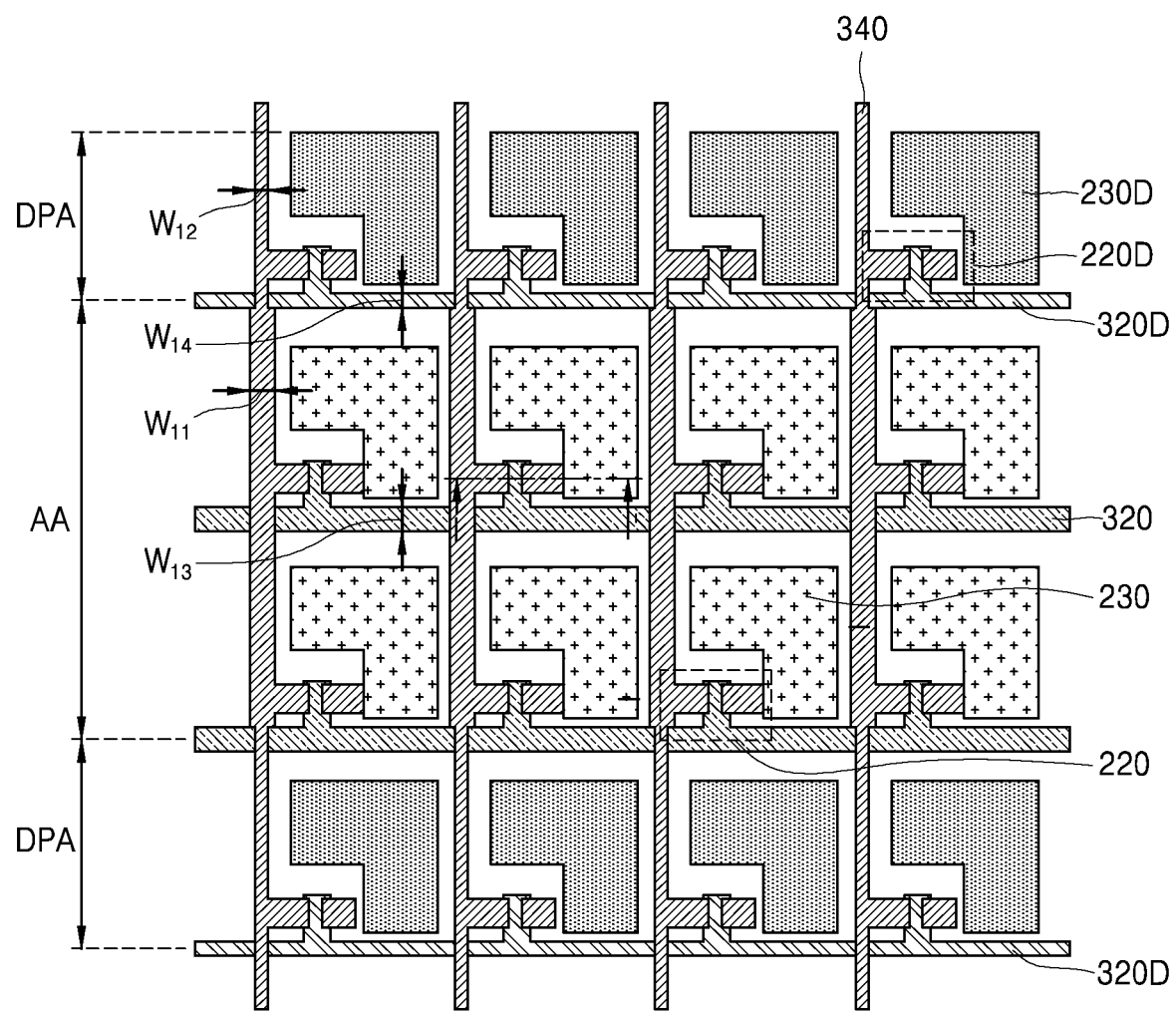
FIG. 3 is a plan view of an array substrate for a digital X-ray detector and a digital X-ray detector including the same according to the first aspect of the present disclosure.

In the first aspect according to FIG. 3, the active area AA includes a plurality of pixel areas PA. The plurality of pixel areas PA may be defined by intersections between a plurality of gate lines 320 and a plurality of data lines 340 arranged in a matrix form having a plurality of rows and a plurality of columns.

Each of the plurality of data lines 340 may extend in a vertical direction of the active area AA, while each of the plurality of gate lines 320 may extend in a horizontal direction of the active area AA.

In this case, the vertical direction of the active area AA means a direction passing through the top and the bottom of the active area AA. The dummy pixel area DPA extends on and along each of the top and the bottom of the active area AA.

Accordingly, the plurality of data lines 340 may extend across not only the active area AA, but also each of the first and second dummy pixel areas DPA respectively extending along and on the top and the bottom of the active area AA.

The readout circuitry 140 and the gate driver 120 may be disposed outside the active area AA, for example, in the non-active area.

The readout circuitry 140 may readout the detection signal from the photo-sensitive pixel P through the data line 340. The gate driver 120 may supply the scan signal to the photo-sensitive pixel through the gate line 320.

Each pixel area PA includes a photo-sensitive pixel. Each photo-sensitive pixel includes the PIN diode 230 and the thin-film transistor 220 that is electrically connected to the PIN diode 230.

In the dummy pixel area DPA, a plurality of dummy photo-sensitive pixels having a pattern similar to that of the pixel area PA may be disposed.

Each dummy photo-sensitive pixel may include a dummy PIN diode 230D and a dummy thin-film transistor 220D.

In this case, the dummy PIN diode 230D and the dummy thin-film transistor 220D are not electrically connected to each other, so that the dummy sensing pixel in the dummy pixel area DPA may not substantially operate.

A formation pattern of the dummy photo-sensitive pixel is not limited thereto. Alternatively, the dummy PIN diode 230D and the dummy thin-film transistor 220D may be connected to each other.

However, in this case, the dummy PIN diode 230D itself, or the dummy thin-film transistor 220D itself may have a pattern having electrical discontinuity.

In other words, as long as the dummy photo-sensitive pixel in the dummy pixel area DPA does not substantially operate, the formation pattern thereof is not particularly limited.

The dummy pixel area DPA includes a dummy gate line 320D extending along the dummy pixel area DPA.

The dummy gate line 320D may extend in a direction perpendicular to the extension direction of the data line 340. Therefore, the dummy gate line 320D may extend in a manner parallel to that of the gate line 320.

As described above, the gate line 320 may receive the scan signal from the gate driver 120 and supply the scan signal to the photo-sensitive pixel. However, the dummy gate line 320D may not receive the scan signal from the gate driver 120 and thus may not supply the scan signal to the dummy photo-sensitive pixel.

For example, the dummy gate line 320D may not be electrically connected to the gate driver 120. Alternatively, even when the dummy gate line 320D is electrically connected to the gate driver 120, a separate scan signal may not be supplied to the dummy gate line 320D.

In one example, a width W12 of the data line 340 extending across the dummy pixel area DPA may be smaller than a width W11 of the data line 340 extending across the active area AA.

In other words, the single data line 340 does not have a constant width along an entire length. Rather, the width thereof may vary around a boundary line between the active area AA and the dummy pixel area DPA.

In another example, a point at which the width of the data line 340 varies does not coincide with the boundary line of the active area AA and the dummy pixel area DPA. Rather, the width thereof may gradually increase or decrease around the boundary line.

Moreover, a width W14 of the dummy gate line 320D may be smaller than a width W13 of the gate line 320.

In this case, each of the single dummy gate line 320D and the single gate line 320 may have a constant width along an entire length thereof.

In this way, the width W12 of the data line 340 extending across the dummy pixel area DPA and the width W14 of the dummy gate line 320D extending along the dummy pixel area DPA may be respectively smaller than the width W11 of the data line 340 and the width W13 of the gate line 320 extending across the active area AA. Thus, the static electricity generated during the manufacturing process may be guided to the dummy pixel area DPA rather than the active area AA.

The static electricity is concentrated on a portion of a digital X-ray detector panel where the gate line 320 and the data line 340 overlap each other with the smallest area, that is, a portion thereof where the capacitance between the two lines is the lowest.

Therefore, according to the first aspect, the static electricity may be concentrated on the dummy pixel area DPA where the narrower data line 340 and the narrower dummy gate line 320D intersect each other, rather than on the active area AA.

Therefore, when a short circuit between the lines occurs due to the static electricity, the short circuit may occur in the dummy pixel area DPA, rather than in the active area AA. The line defects may not occur.

Further, the dummy pixel area DPA is not displayed on a screen of the digital X-ray detector. Thus, even when the short circuit between the lines occurs in the dummy pixel area DPA, black spots may not occur on the screen.

Figure 4:
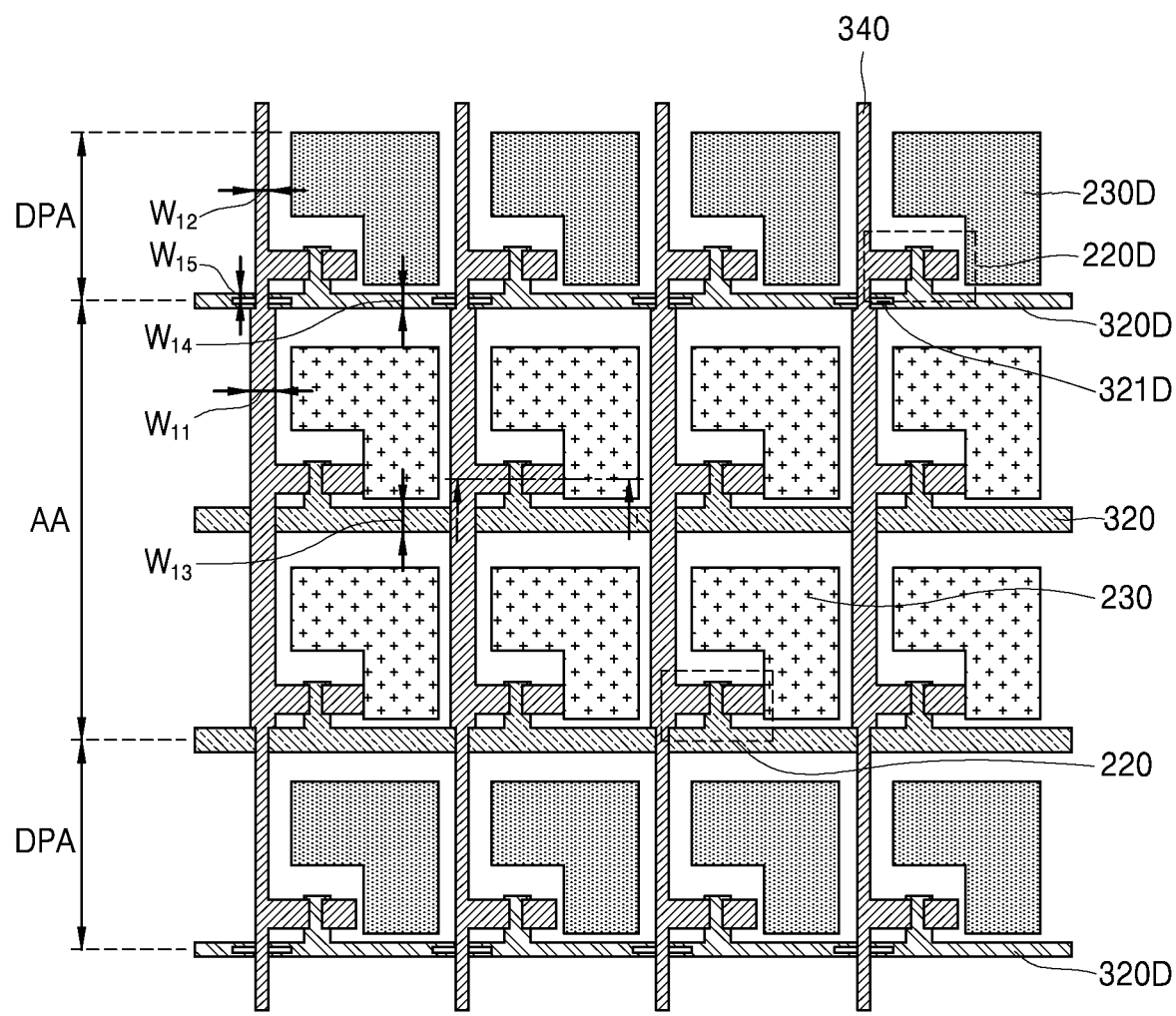
FIG. 4 is a plan view of an array substrate for a digital X-ray detector and a digital X-ray detector including the same according to the second aspect of the present disclosure.

In one example, in the second aspect according to FIG. 4, the dummy gate line 320D may be branched into a plurality of dummy gate branch lines 321D in an area in which the dummy gate line 320D intersects the data line 340.

In this case, a width W15 of the dummy gate branch line 321D may be smaller than the width W14 of the dummy gate line 320D.

Specifically, the dummy gate line 320D may be branched into at least two dummy gate branch lines 321D, and the widths W15 of the at least two dummy gate branch lines 321D may be equal to each other.

When the widths W15 of the at least two dummy gate branch lines 321D are equal to each other, a sequence in which the short circuits occur due to the static electricity may not be determined in a specific manner.

However, the present disclosure is not limited thereto. The widths W15 of the at least two dummy gate branch lines 321D may be different from each other. When the widths W15 of the at least two dummy gate branch lines 321D are different from each other, the short circuit may occur at the dummy gate branch line 321D having a relatively smaller width.

That is, when the widths W15 of the at least two dummy gate branch lines 321D are different from each other, the short circuit may first occur in the dummy gate branch line 321D having a relatively smaller width, and then may occur in the dummy gate branch line 321D having a relatively larger width.

When the dummy gate line 320D is branched into the plurality of dummy gate branch lines 321D, the width of each dummy gate branch line 321D being smaller than that of the dummy gate line 320D, the capacitance between the dummy gate branch line 321D and the data line 340 becomes even lower at an intersection between the dummy gate branch line 321D and the data line 340.

Therefore, according to the second aspect, the static electricity may be concentrated on the dummy pixel area DPA where the data line 340 and the plurality of dummy gate branch lines 321D intersect each other, rather than on the active area AA.

In particular, in the second aspect, because the dummy gate line 320D is branched into the plurality of dummy gate branch lines 321D, the width of each dummy gate branch line 321D being smaller than that of the dummy gate line 320D, the capacitance between the dummy gate branch line 321D and the data line 340 becomes even lower at an intersection area between the dummy gate branch line 321D and the data line 340.

In addition, when the dummy gate line 320D is branched into the plurality of dummy gate branch lines 321D, the width of each dummy gate branch line 321D being smaller than that of the dummy gate line 320D, loss from a total amount of capacitance may be minimized, thereby loss of a total amount of buffer that may generate the static electricity in the intersection area may be minimized.

In addition, when the dummy gate line 320D is branched into the plurality of dummy gate branch lines 321D, the width of each dummy gate branch line 321D being smaller than that of the dummy gate line 320D, the number of the dummy gate branch lines 321D overlapping with the data line 340 increases. Thus, a chance or a probability by which the short circuit occurs in the dummy gate branch line 321D due to the static electricity induced therein may be increased.

In addition, when the number of the dummy gate branch lines 321D increases significantly, a sum of the widths W15 of all of the dummy gate branch lines 321D becomes larger than the width W14 of the dummy gate line 320D. Thus, an area where the plurality of dummy gate branch lines 321D overlaps the data line 340 may also be greatly increased.

Accordingly, the chance and the probability by which the short circuit occurs in the dummy gate branch line 321D due to the static electricity induced therein may be increased.

Further, even when a burn phenomenon occurs in a single dummy gate branch line 321D due to the static electricity concentrated thereon and thus the electrical conductivity thereof is lowered, the static electricity may continue to flow into the remaining dummy gate branch lines 321D because the plurality of dummy gate branch lines 321D are present.

In addition, the signal does not flow in the dummy gate line 320D. Thus, even when all of the plurality of dummy gate branch lines 321D are burned, the burn may not affect the operation of the digital X-ray detector. Thus, the static electricity may be effectively induced by forming the plurality of dummy gate branch lines 321D, each having the smaller width.

Figure 5:
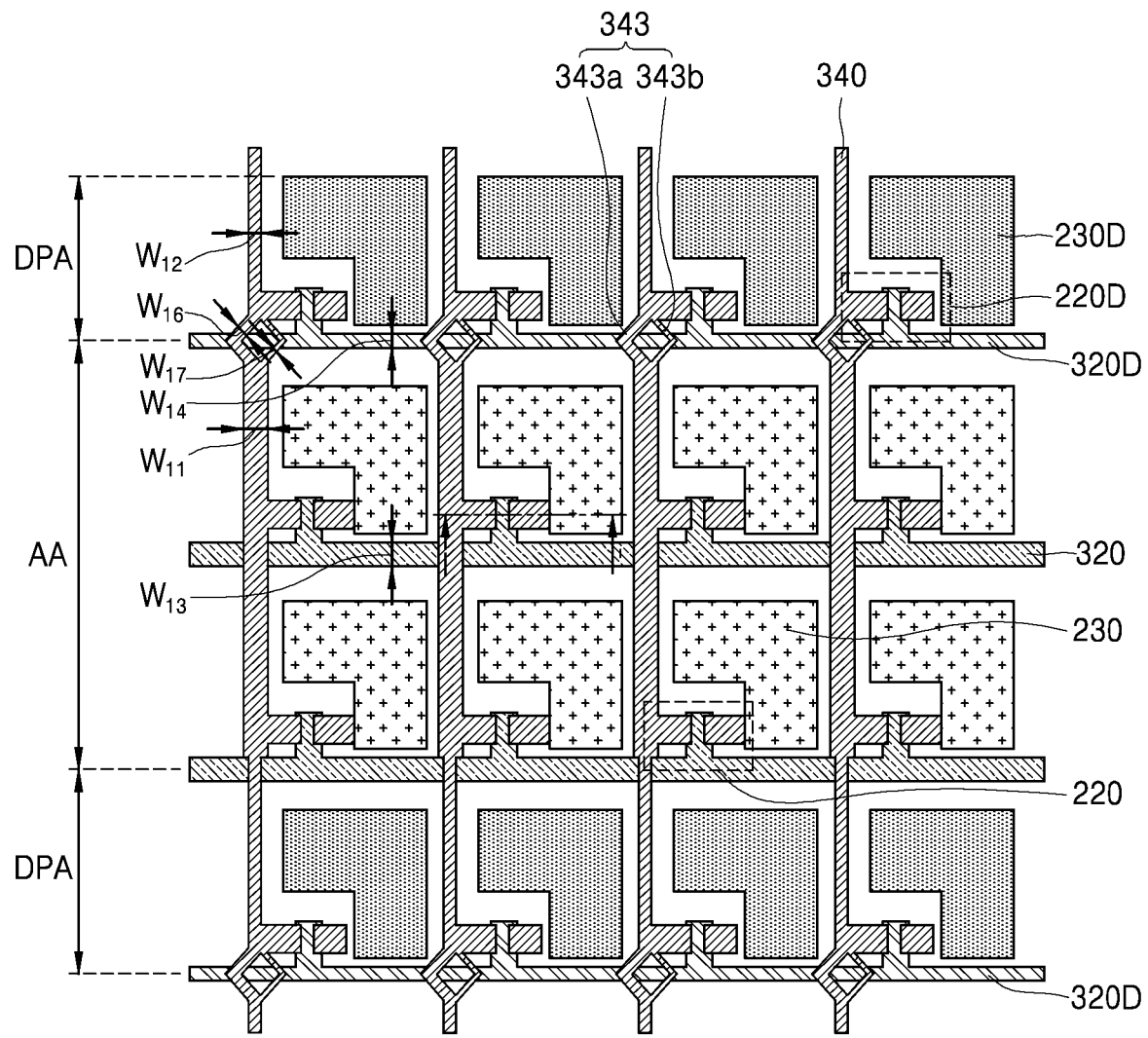
FIG. 5 is a plan view of an array substrate for a digital X-ray detector and a digital X-ray detector including the same according to the third aspect of the present disclosure.

In one example, in the third aspect according to FIG. 5, the data line 340 may be branched to a plurality of data branch lines 343 in an area in which the data line 340 intersects the dummy gate line 320D.

In this case, the widths of the plurality of data branch lines 343 may be different from each other.

Specifically, a width of at least one among the plurality of data branch lines 343 may be smaller than the width of the data line 340 extending across the active area AA.

Further, a width of at least one among the plurality of data branch lines 343 may be smaller than the width of the data line 340 extending across the dummy pixel area DPA.

For example, the plurality of data branch line 343 may include a first data branch line 343a and a second data branch line 343b.

Although an example in which the plurality of data branch lines 343 include two data branch lines is shown in FIG. 5, the present disclosure is not limited thereto. The plurality of data branch lines 343 may include at least two data branch lines.

In this case, a width W16 of the first data branch line 343a may be larger than a width W17 of the second data branch line 343b. That is, the width W17 of the second data branch line 343b may be smaller than the width W16 of the first data branch line 343a.

Further, the width W17 of the second data branch line 343b may be smaller than the width W11 of the data line 340 extending across the active area AA, and may be smaller than the width W12 of the data line 340 extending across the dummy pixel area DPA.

In one example, the width W16 of the first data branch line 343a may be equal to the width W11 of the data line 340 extending across the active area AA or the width W12 of the data line 340 extending across the dummy pixel area DPA. The present disclosure is not limited thereto.

As described above, branching the data line 340 to the plurality of data branch lines 343 having different widths in the area where the data line 340 intersects the dummy gate line 320D may allow the static electricity to be concentrated on a data branch line with a relatively smaller width.

For example, when the static electricity is concentrated on the second data branch line 343b which has a relatively smaller width, a burn phenomenon may occur in the second data branch line 343b and thus the electrical conductivity of the second data branch line 343b is extremely low. Thus, no signal flows in the second data branch line 343b.

However, the first data branch line 343a which has a relatively larger width has a low resistance and thus has high electrical conductivity. Thus, a signal may flow through the first data branch line 343a.

Therefore, the second data branch line 343b may play a role of inducing the static electricity, while the first data branch line 343a may play a role of transmitting the signal normally. Thus, the burn of the second data branch line 343b does not affect the operation of the digital X-ray detector.

Further, the data line 340 extending across the dummy pixel area DPA must transmit the signal from the active area AA. To this end, the width W16 of the first data branch line 343a may be equal to the width W11 of the data line 340 extending across the active area AA or the width W12 of the data line 340 extending across the dummy pixel area DPA, so that the readout signal may be normally delivered to the readout circuitry 140.

Figure 6:
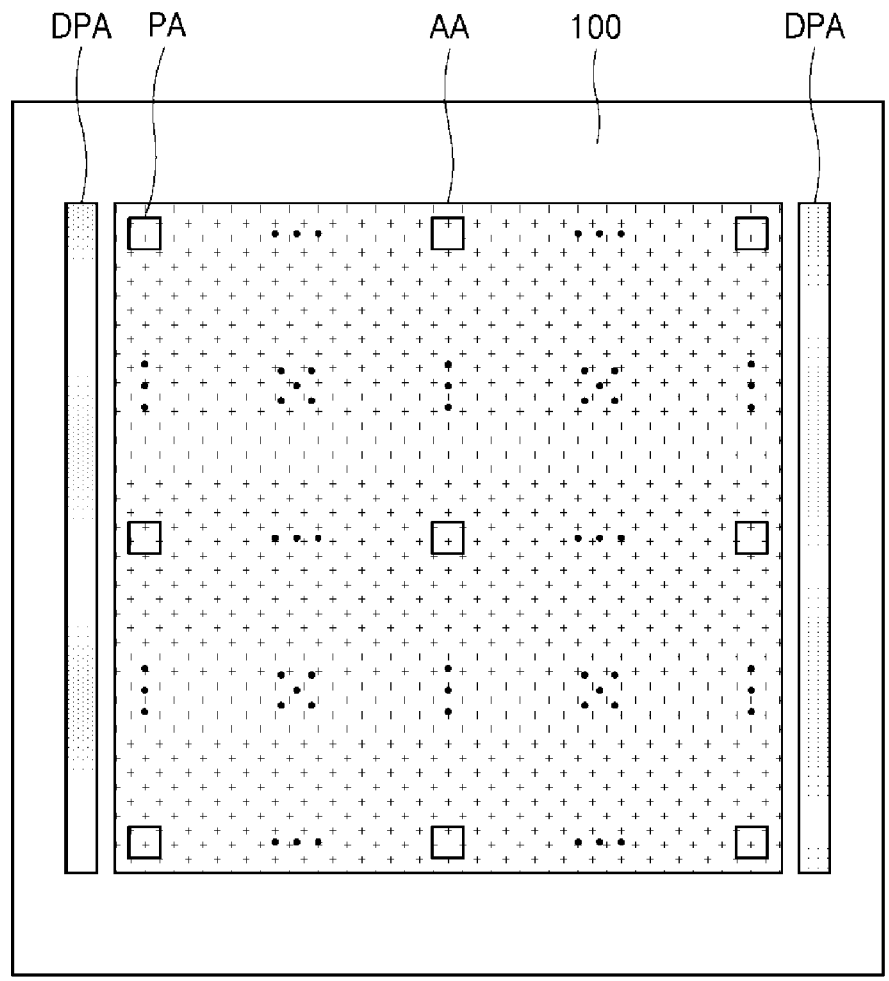
FIG. 6 is a schematic arrangement diagram of an active area and dummy pixel areas of an array substrate for a digital X-ray detector and a digital X-ray detector according to a fourth aspect to a sixth aspect of the present disclosure.

Further, as shown in FIG. 6, an array substrate 100 for a digital X-ray detector according to another aspect of the present disclosure may include the active area AA including the plurality of pixel areas defined by intersections between a plurality of gate lines and a plurality of data lines arranged in a matrix form having a plurality of rows and a plurality of columns; and first and second dummy pixel areas DPA, wherein the first dummy pixel area extends on and along one side of the active area, while the second dummy pixel area extends on and along the opposite side of the active area.

The array substrate 100 for a digital X-ray detector includes the active area AA and a non-active area around the active area AA.

The active area AA includes a plurality of pixel areas PA.

In the non-active area, pad-related components such as the gate driver 120 and the readout circuitry 140 connected to the photo-sensitive pixels P in the pixel area PA may be disposed.

Further, the dummy pixel area DPA may be disposed in the non-active area. As in one aspect of the present disclosure, each dummy pixel area DPA may extend along and on each of one side and the opposite side of the active area AA, specifically, a left side and a right side of the active area AA.

The dummy pixel area DPA refers to a dummy area that has a pattern similar to that of one column of the pixel areas PA, but does not substantially contribute to the operation of the digital X-ray detector.

The fourth aspect to the sixth aspect as described below may have the same arrangement of the active area AA and the dummy pixel areas DPA. The fourth aspect to the sixth aspect will be described in detail with reference to FIGS. 7 to 9.

Figure 7:
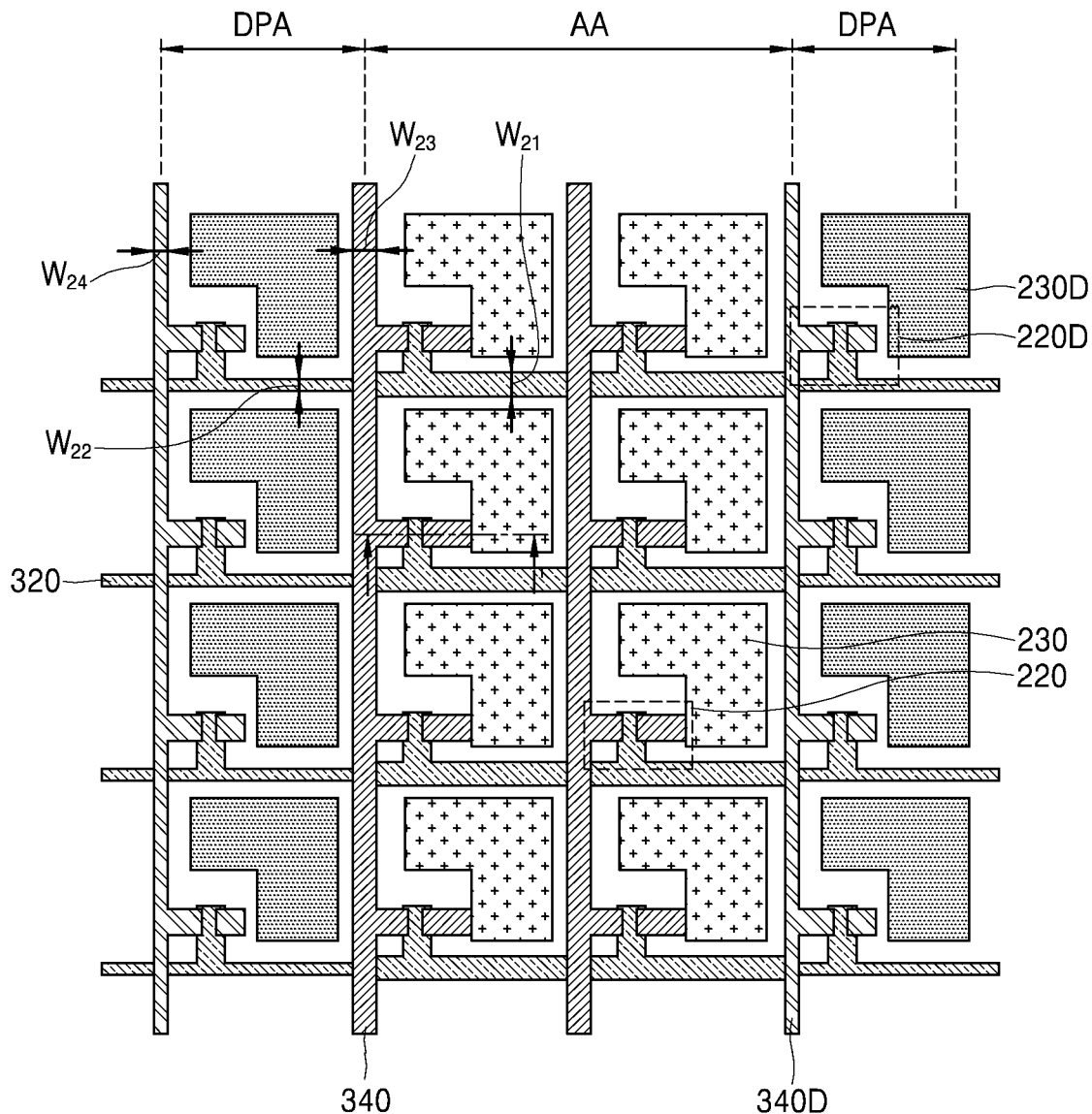
FIG. 7 is a plan view of an array substrate for a digital X-ray detector and a digital X-ray detector including the same according to the fourth aspect of the present disclosure.

In the fourth aspect according to FIG. 7, the active area AA includes a plurality of pixel areas PA. The plurality of pixel areas PA may be defined by intersections between a plurality of gate lines 320 and a plurality of data lines 340 arranged in a matrix form having a plurality of rows and a plurality of columns.

Each of the plurality of data lines 340 may extend in a vertical direction of the active area AA, while each of the plurality of gate lines 320 may extend in a horizontal direction of the active area AA.

In this case, the vertical direction of the active area AA means a direction between the top and the bottom of the active area AA. The dummy pixel area DPA does not extend on and along each of the top and the bottom of the active area AA.

Accordingly, the plurality of gate lines 340 may extend across not only the active area AA, but also each of the first and second dummy pixel areas DPA respectively extending along and on the left and right sides of the active area AA.

The dummy pixel area DPA includes a dummy data line 340D extending along the dummy pixel area DPA.

The dummy data line 340D may extend in a direction perpendicular to the extension direction of the gate line 320. Therefore, the dummy data line 340D may extend in a manner parallel to that of the data line 340.

As described above, the data line 340 may transmit the detection signal from the photo-sensitive pixel to the readout circuitry 140. However, the dummy data line 340D may not transmit a separate detection signal to the readout circuitry 140.

For example, the dummy data line 340D may not be electrically connected to the readout circuitry 140. However, if so, a separate readout detection signal may not be transmitted through the dummy data line 340D.

In one example, a width W22 of the gate line 320 extending across the dummy pixel area DPA is smaller than a width W21 of the gate line 320 extending across the active area AA.

In other words, the single gate line 320 does not have a constant width along an entire length. Rather, the width thereof may vary around a boundary line between the active area AA and the dummy pixel area DPA.

In another example, a point at which the width of the gate line 320 varies does not coincide with the boundary line between the active area AA and the dummy pixel area DPA. Rather, the width the gate line 320 may gradually increase or decrease around the boundary line.

Moreover, a width W24 of the dummy data line 340D is smaller than a width W23 of the data line 340.

In this case, each of the single dummy data line 340D and the single data line 340 may have a constant width along an entire length thereof.

In this way, when the width W22 of the gate line 320 and the width W24 of dummy data line 340D in the dummy pixel area DPA are respectively smaller than the width W21 of the gate line 320 and the width W23 of the data line 340 in the active area AA, the static electricity generated during the manufacturing process may be guided to the dummy pixel area DPA rather than to the active area AA.

The static electricity is concentrated on a portion of a digital X-ray detector panel where the gate line 320 and the data line 340 overlap each other with the smallest area, that is, a portion thereof where the capacitance between the two lines is the lowest.

Therefore, according to the fourth aspect, the static electricity may be concentrated on the dummy pixel area DPA where the narrower gate line 320 and the narrower dummy data line 340D intersect each other, rather than on the active area AA.

Therefore, when a short circuit between the lines occurs due to the static electricity, the short circuit may occur in the dummy pixel area DPA, rather than in the active area AA. The line defects may not occur.

Further, the dummy pixel area DPA is not displayed on a screen of the digital X-ray detector. Thus, even when the short circuit between the lines occurs in the dummy pixel area DPA, black spots may not occur on the screen.

Figure 8:
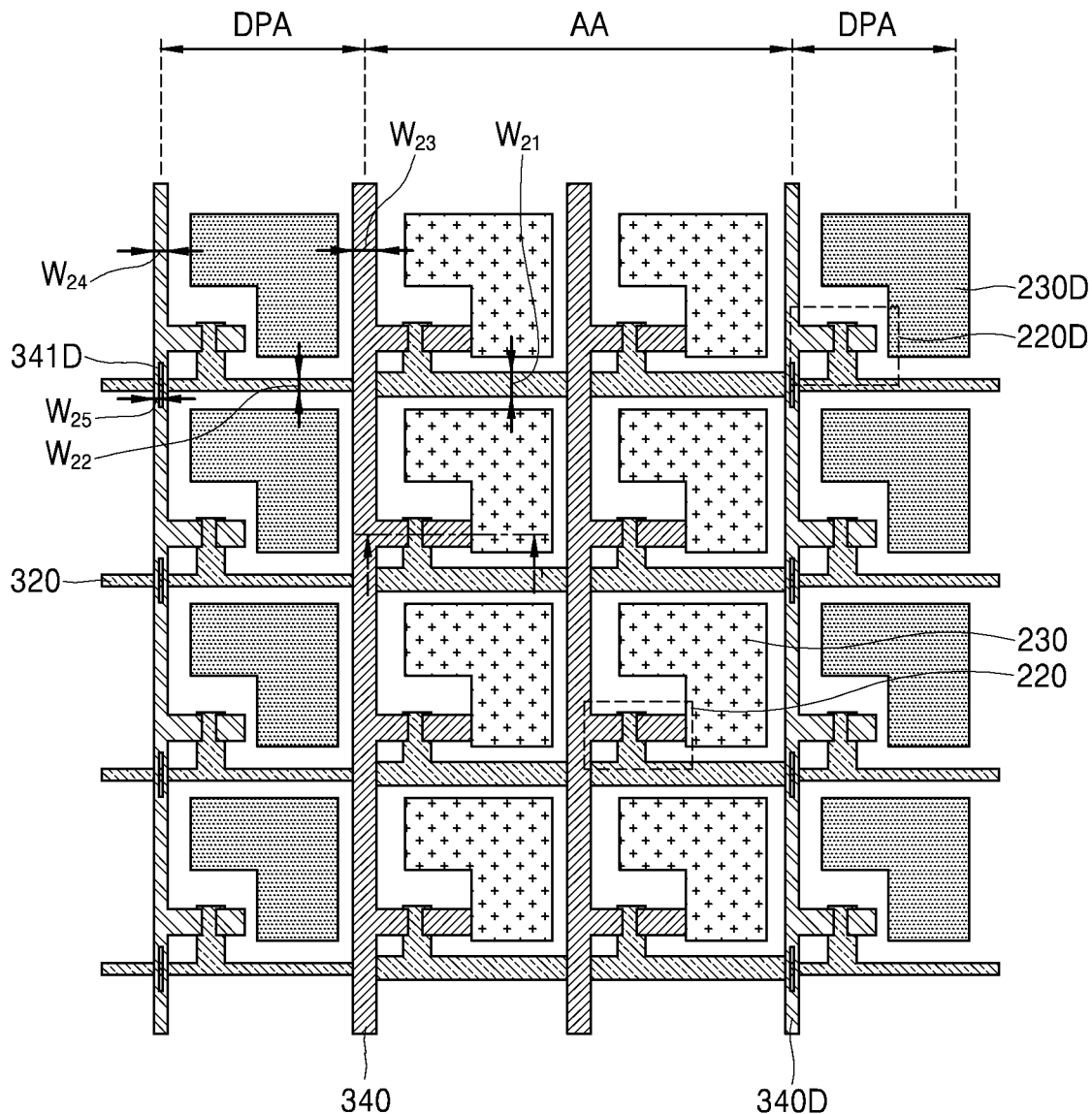
FIG. 8 is a plan view of an array substrate for a digital X-ray detector and a digital X-ray detector including the same according to the fifth aspect of the present disclosure.

In one example, in the fifth aspect according to FIG. 8, the dummy data line 340D may be branched into a plurality of dummy data branch lines 341D in an area in which the dummy data line intersects the gate line 320.

In this case, a width W25 of each of the dummy data branch lines 341D may be smaller than a width W24 of the dummy data line 340D.

Specifically, the dummy data line 340D may be branched into at least two dummy data branch lines 341D. The widths W25 of the dummy data branch lines 341D may be equal to each other.

When the widths W25 of the branched dummy data branch lines 341D are equal to each other, a sequence in which the short circuits occur due to the static electricity may not be determined in a specific manner.

However, the present disclosure is not limited thereto. The widths W25 of the dummy data branch lines 341D may be different from each other. When the widths W25 of the dummy data branch lines 341D are different from each other, the short circuit may occur at the dummy data branch line 341D having a relatively smaller width.

That is, when the widths W25 of the dummy data branch lines 341D are different from each other, the short circuit may first occur in the dummy data branch line 341D having a relatively smaller width, and then may occur in the dummy data branch line 341D having a relatively larger width.

When the dummy data line 340D is branched into the plurality of dummy data branch lines 341D, the width of each dummy data branch lines 341D being smaller than that of the dummy data line 340D, the capacitance between the dummy data branch line 341D and the gate line 320 becomes even lower at an intersection between the dummy data branch line 341D and the gate line 320.

Therefore, according to the fifth aspect, the static electricity may be concentrated on the dummy pixel area DPA where the gate line 320 and the plurality of dummy data branch lines 341D intersect each other, rather than on the active area AA.

In particular, in the fifth aspect, because the dummy data line 340D is branched into the plurality of dummy data branch lines 341D, the width of each dummy data branch lines 341D being smaller than that of the dummy data line 340D, the capacitance between the dummy data branch line 341D and the gate line 320 becomes even lower at an intersection area between the dummy data branch line 341D and the gate line 320.

In addition, when the dummy data line 340D is branched into the plurality of dummy data branch lines 341D, the width of each dummy data branch lines 341D being smaller than that of the dummy data line 340D, loss from a total amount of capacitance may be minimized, thereby loss of a total amount of buffer that may generate the static electricity in the intersection area may be minimized.

In addition, when the dummy data line 340D is branched into the plurality of dummy data branch lines 341D, the width of each dummy data branch lines 341D being smaller than that of the dummy data line 340D, the number of the dummy data branch lines 341D overlapping with the gate line 320 increases. Thus, a chance or a probability by which the short circuit occurs in the dummy data branch line 341D due to the static electricity induced therein may be increased.

In addition, when the number of the dummy data branch lines 341D increases significantly, a sum of the widths W25 of all of the dummy data branch lines 341D becomes close to the width W24 of the dummy data line 340D. Thus, an area where the plurality of dummy data branch lines 341D overlaps the gate line 320 may also be greatly increased.

Accordingly, the chance and the probability by which the short circuit occurs in the dummy data branch line 341D due to the static electricity induced therein may be increased.

Further, even when a burn phenomenon occurs in a single dummy data branch line 341D due to the static electricity concentrated thereon and thus the electrical conductivity thereof is lowered, the static electricity may continue to flow into the remaining dummy data branch lines 341D because the plurality of dummy data branch lines 341D are present.

In addition, the signal does not flow in the dummy data line 340D. Thus, even when all of the plurality of dummy data branch lines 341D are burned, the burn may not affect the operation of the digital X-ray detector. Thus, the static electricity may be effectively induced by forming the plurality of dummy data branch lines 341D, each having the smaller width.

Figure 9:
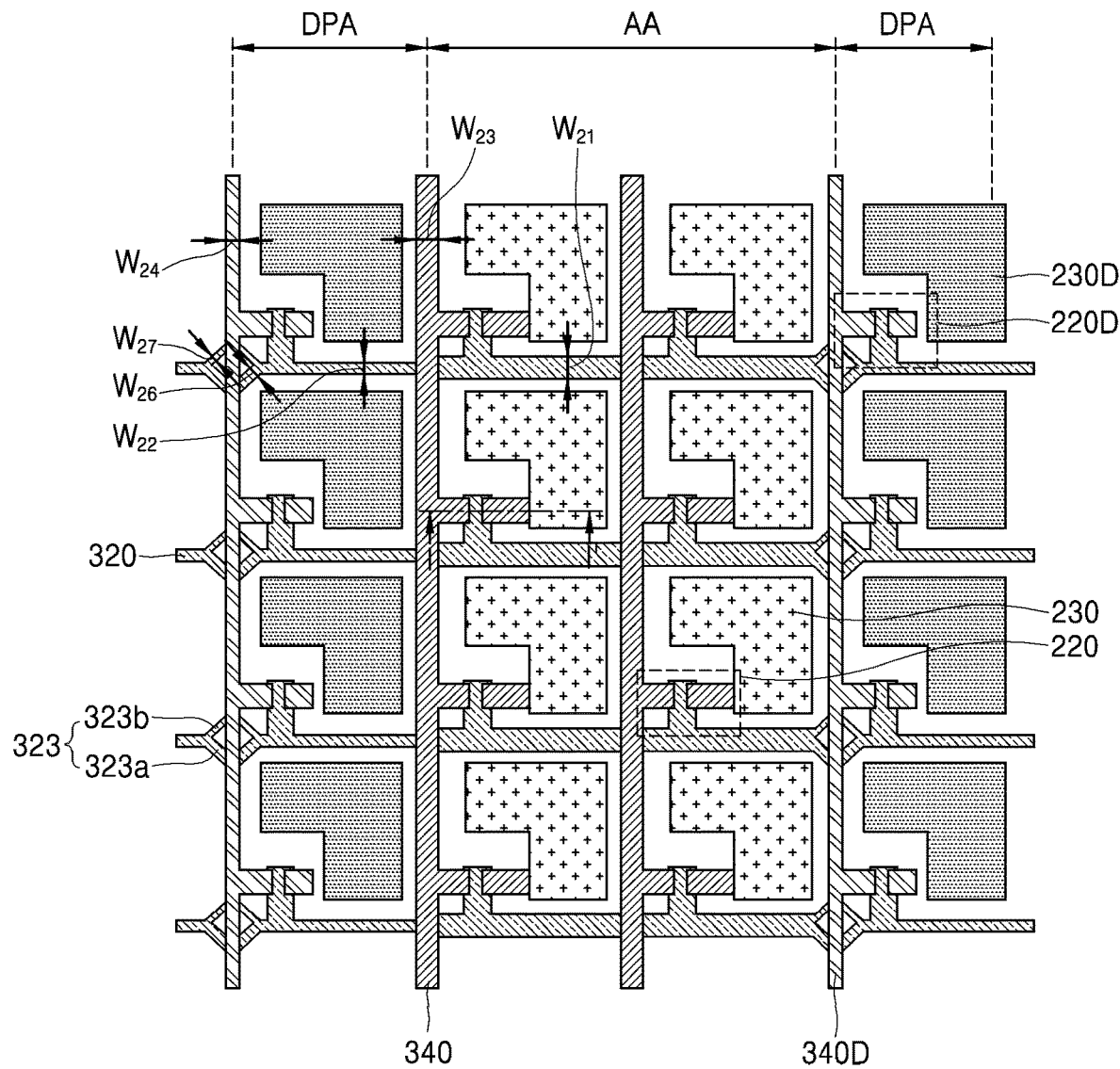
FIG. 9 is a plan view of an array substrate for a digital X-ray detector and a digital X-ray detector including the same according to the sixth aspect of the present disclosure.

In one example, in the sixth aspect according to FIG. 9, the gate line 320 may be branched to a plurality of gate branch lines 323 in an area in which the gate line 320 intersects the dummy data line 340D.

In this case, the widths of the plurality of gate branch lines 323 may be different from each other.

Specifically, a width of at least one among the plurality of gate branch lines 323 may be smaller than a width of a portion of the gate line 320 extending across the active area AA.

Further, a width of at least one among the plurality of gate branch lines 323 may be smaller than a width of a portion of the gate line 320 extending across the dummy pixel area DPA.

For example, the plurality of gate branch line 323 may include a first gate branch line 323a and a second gate branch line 323b.

Although an example in which the plurality of gate branch line 323 includes two gate branch lines is shown in FIG. 9, the present disclosure is not limited thereto. The plurality of gate branch lines 323 may include at least two gate branch lines.

In this case, a width W26 of the first gate branch line 323a may be larger than a width W27 of the second gate branch line 323b. That is, the width W27 of the second gate branch line 323b may be smaller than the width W26 of the first gate branch line 323a.

Further, the width W27 of the second gate branch line 323b may be smaller than the width W21 of a portion of the gate line 320 extending across the active area AA, and may be smaller than the width w22 of a portion of the gate line 320 extending across the dummy pixel area DPA.

In one example, the width W26 of the first gate branch line 323a may be equal to the width W21 of a portion of the gate line 320 extending across the active area AA or the width W22 of a portion of the gate line 320 extending across the dummy pixel area DPA. The present disclosure is not limited thereto.

As described above, branching the gate line 320 to the plurality of gate branch lines 323 having different widths in the area where the gate line 320 intersects the dummy data line 340D may allow the static electricity to be concentrated on a gate branch line with a relatively smaller width.

For example, when the static electricity is concentrated on the second gate branch line 323b which has a relatively smaller width, a burn phenomenon may occur in the second gate branch line 323b and thus the electrical conductivity of the second gate branch line 323b is extremely low. Thus, no signal flows in the second gate branch line 323b.

However, the first gate branch line 323a which has a relatively larger width has a low resistance and thus has high electrical conductivity. Thus, a signal may flow through the first gate branch line 323a.

Therefore, the second gate branch line 323b may play a role of inducing the static electricity, while the first gate branch line 323a may play a role of transmitting the signal normally. Thus, the burn of the second gate branch line 323b does not affect the operation of the digital X-ray detector.

Further, a portion of the gate line 320 extending across the dummy pixel area DPA must transmit the signal from the active area AA. To this end, the width W26 of the first gate branch line 323a may be equal to the width W21 of a portion of the gate line 320 extending across the active area AA or the width W22 of a portion of the gate line 320 extending across the dummy pixel area DPA, so that the scan signal may be normally delivered to the active area AA.

On the screen of the digital X-ray detector, an area where a line defect of the data line 340 occurs may be indicated in a white color, and an area in which the short circuit between the gate line 320 and the data line 340 occurs may be indicated in a black color.

In this regard, according to an aspect of the present disclosure, the static electricity may be guided to the dummy gate line 320D or the dummy data line 340D in the dummy pixel area DPA, rather than to the active area AA. Thus, when the static electricity is generated in the gate line 320 and the data line 340, the effect thereof on the operation of the digital X-ray detector is minimized, thereby the line defects or the block luminance deviation defects caused by the static electricity generated during the manufacturing process may be minimized.

In particular, according to an aspect of the present disclosure, the line defect or the short circuit between the gate line 320 and the data line 340 caused by the static electricity may occur in the dummy pixel area DPA rather than the active area AA corresponding to the screen. This may prevent the static electricity from affecting the operation of the digital X-ray detector and the actual display screen.

Figure 10:
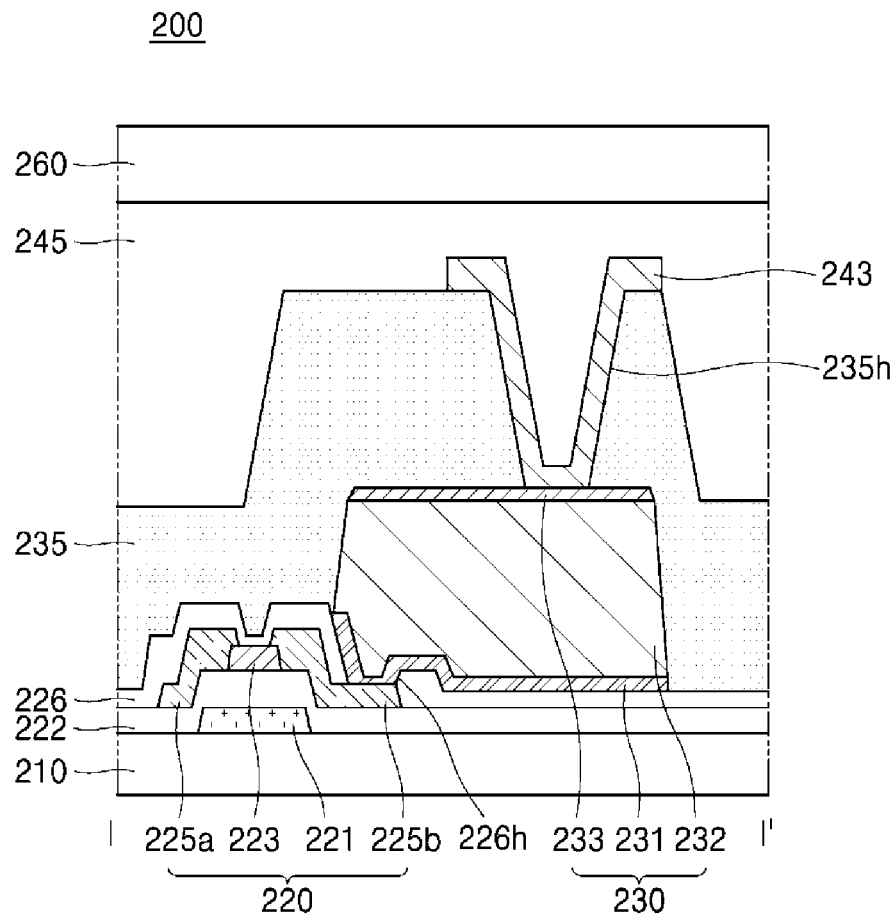
FIG. 10 is a cross-sectional view of an array substrate for a digital X-ray detector corresponding to a single pixel area and a digital X-ray detector including the same according to an aspect of the present disclosure.

FIG. 10 is a cross-sectional view of an array substrate for a digital X-ray detector corresponding to a single pixel area and a digital X-ray detector including the same according to an aspect of the present disclosure.

A digital X-ray detector 200 according to an aspect of the present disclosure includes a base substrate 210.

The base substrate 210 may embodied as a glass substrate. However, the present disclosure is not limited thereto. When the base substrate 210 is applied to a flexible digital X-ray detector, the base substrate 210 may be made of a polyimide material having a flexible property.

The base substrate 210 includes an active area AA and a pad area PDA. The active area AA may include a plurality of pixel areas PA.

Each thin-film transistor 220 and each PIN diode 230 may belong to each pixel. Thus, a plurality of thin-film transistors 220 and a plurality of PIN diodes 230 may be formed in the array substrate having the plurality of pixel areas PA.

Hereinafter, following descriptions are based on the thin-film transistor 220 and the PIN diode 230 corresponding to a single pixel, and thus are equally applied to a pixel adjacent thereto unless otherwise specified.

On the base substrate 210, the thin-film transistor 220 including a first electrode 225a, a second electrode 225b, a gate electrode 221 and an active layer 223 is formed.

A buffer layer (not shown) may be formed between the base substrate 210 and the thin-film transistor 220. In this case, the buffer layer may be composed of an inorganic material film such as a silicon oxide film SiOx or a silicon nitride film SiNx, and may be embodied as a multi-layered buffer layer.

The gate electrode 221 may extend from a gate line 320. Further, the gate electrode 221 may be integrated with the gate line 320 so that the gate line 320 may act as the gate electrode 221. Accordingly, the gate line 320 and the gate electrode 221 may constitute the same layer.

A gate insulating layer 222 may be formed on the gate electrode 221. The active layer 223 may be formed on the gate insulating layer 222.

The active layer 223 may be made of an oxide semiconductor material such as IGZO (Indium Gallium Zinc Oxide) but is not limited thereto. The active layer 221 may be made of LTPS (Low Temperature Polycrystalline Silicon) or amorphous silicon (a-Si).

On the active layer 223, the first electrode 225a and the second electrode 225b may be formed such that the first electrode 225a and the second electrode 225b are connected to one end and the opposite end of the active layer 223, respectively.

In this case, the first electrode 225a may branch from a data line 340 and may act as a drain electrode.

The second electrode 225b may be spaced apart from the first electrode 225a. The second electrode 225b and the first electrode 225a may constitute the same layer. The second electrode 225b may act as a source electrode connected to the PIN diode 230.

A first passivation layer 226 as an insulating layer may be formed on the active layer 223, the first electrode 225a, and the second electrode 225b.

On the first passivation layer 226, the PIN diode 230 may be formed, which may be connected to the underlying thin-film transistor 220. The PIN diode 230 may be disposed in the pixel area PA.

The PIN diode 230 may include a lower electrode 231 connected to the thin-film transistor 220, a PIN layer 232 on the lower electrode 231, and an upper electrode 233 on the PIN layer 232.

The lower electrode 231 may serve as a pixel electrode in the PIN diode 230.

The lower electrode 231 may be connected to the second electrode 225b of the thin-film transistor 220 via a first contact-hole 226h defined in the first passivation layer 226. Thus, the thin-film transistor 220 may be connected to the PIN diode 230.

On the lower electrode 231, the PIN layer 232 for converting visible light converted from X-rays via the scintillator into an electrical signal may be formed.

The PIN layer 232 may be formed by sequentially stacking an n-type semiconductor layer including n-type impurities, an intrinsic semiconductor layer, and a p-type semiconductor layer including p-type impurities on the lower electrode 231.

The intrinsic semiconductor layer may be relatively thicker than each of the n-type semiconductor layer and the p-type semiconductor layer. The PIN layer 232 may be formed to include a material capable of converting the visible light into which the scintillator converts the X-ray into the electrical signal. For example, the PIN layer 243 may include materials such as a-Se, HgI2, CdTe, PbO, PbI2, BiI3, GaAs, and Ge.

The upper electrode 233 may be formed on the PIN layer 232. The upper electrode 233 may be made of at least one material selected from transparent oxides such as ITO (Indium Tin Oxide), IZO (Indium Zinc Oxide), and ZnO (Zinc Oxide), so that a fill factor of the PIN diode 230 may be improved.

A second passivation layer 235 as an insulating layer may be formed on the PIN diode 230.

A bias electrode 243 may be formed on the second passivation layer 235 on the PIN diode 230. The bias electrode 243 may be connected to the upper electrode 233 of the PIN diode 230 via a contact-hole of the second passivation layer 235, so that a bias voltage may be applied to the PIN diode 230.

The bias electrode 243 may branch from a bias line BL extending in a manner parallel to the data line 340.

A planarization layer 245 may be formed on the bias electrode 243 to cover an entire face of the base substrate 210 and the PIN diode 230. The planarization layer 245 may be made of organic materials such as PAC (Photo Acryl). The present disclosure is not limited thereto.

A scintillator layer 260 may be formed on the planarization layer 245 to cover the PIN diode 230.

Specifically, the scintillator layer 260 may be formed on the thin-film transistor 220 and the PIN diode 230 to cover the thin-film transistor 220 and the PIN diode 230.

The scintillator layer 260 may be grown in a vertical direction to have a plurality of columnar crystal phases, so that a plurality of scintillator columnar crystals may be arranged in a side-by-side manner. The present disclosure is not limited thereto. The scintillator may be made of a material such as cesium iodide (CsI) or thallium iodide (TlI). The present disclosure is not limited thereto.

The digital X-ray detector 200 according to the present disclosure operates as follows.

X-ray is irradiated to the digital X-ray detector 200. The scintillator layer 260 converts the X-ray into the visible light. The PIN layer 232 of the PIN diode 230 converts the light in the visible light range into an electrical signal.

Specifically, when the light in the visible light range is irradiated to the PIN layer 232, the intrinsic semiconductor layer is brought into a depleted state due to the n-type semiconductor layer and the p-type semiconductor layer, and an electric field is generated therein. Moreover, holes and electrons generated by the light are drifted by the electric field and are collected in the p-type semiconductor layer and the n-type semiconductor layer, respectively.

The PIN diode 230 converts the light in the visible light range into the detection signal as an electrical signal, and transmits the signal to the thin-film transistor 220. The transmitted detection signal is outputted as an image signal via the data line 340 connected to the thin-film transistor 220.

The present disclosure may include following aspects and implementations thereof.

A first aspect of the present disclosure provides an array substrate for a digital X-ray detector, the array substrate comprising an active area including a plurality of pixel areas defined by intersections between a plurality of gate lines and a plurality of data lines arranged in a matrix form having a plurality of rows and a plurality of columns; and first and second dummy pixel areas, wherein the first dummy pixel area extends on and along one side of the active area, while the second dummy pixel area extends on and along the opposite side of the active area, wherein a first dummy gate line extends along the first dummy pixel area, and a second dummy gate line extends along the second dummy pixel area, wherein each data line extends across the active area, the first dummy pixel area, and the second dummy pixel area, wherein a width of each data line in each of the first and second dummy pixel areas is smaller than a width of each data line in the active area, wherein each dummy gate line may extend in a manner parallel to an extension direction of each gate line, wherein a width of each dummy gate line is smaller than a width of each gate line.

In one implementation of the first aspect, each dummy gate line is branched into a plurality of dummy gate branch lines in an area in which each dummy gate line intersects each data line.

In one implementation of the first aspect, a width of each dummy gate branch line is smaller than a width of each dummy gate line.

In one implementation of the first aspect, widths of the plurality of dummy gate branch lines are equal to each other.

In one implementation of the first aspect, each data line is branched into a plurality of data branch lines in an area in which each data line intersects each dummy gate line.

In one implementation of the first aspect, widths of the plurality of data branch lines are different from each other.

In one implementation of the first aspect, a width of at least one data branch line among the plurality of data branch lines is smaller than a width of each data line in the active area.

In one implementation of the first aspect, a width of at least one data branch line among the plurality of data branch lines is smaller than a width of each data line in each dummy pixel area.

In one implementation of the first aspect, each pixel area includes a photo-sensitive pixel, wherein each photo-sensitive pixel includes a PIN (P-type/I-type/N-type semiconductors) diode, and a thin-film transistor electrically connected to the PIN diode.

In one implementation of the first aspect, the array substrate further comprises a readout circuitry and a gate driver disposed outside the active area, wherein the readout circuitry reads out a detection signal from each photo-sensitive pixel via each data line, wherein the gate driver supplies a scan signal to each photo-sensitive pixel via each gate line.

In one implementation of the first aspect, the width of each data line gradually varies around a boundary line between the active area and each dummy pixel area.

A second aspect of the present disclosure provides an array substrate for a digital X-ray detector, the array substrate comprising an active area including a plurality of pixel areas defined by intersections between a plurality of gate lines and a plurality of data lines arranged in a matrix form having a plurality of rows and a plurality of columns; and first and second dummy pixel areas, wherein the first dummy pixel area extends on and along one side of the active area, while the second dummy pixel area extends on and along the opposite side of the active area, wherein a first dummy data line extends along the first dummy pixel area, and a second dummy data line extends along the second dummy pixel area, wherein each gate line extends across the active area and each dummy pixel area, wherein a width of each gate line in each dummy pixel area is smaller than a width of each gate line in the active area, wherein each dummy data line may extend in a manner parallel to an extension direction of each data line, wherein a width of each dummy data line is smaller than a width of each data line.

In one implementation of the second aspect, each dummy data line is branched into a plurality of dummy data branch lines in an area in which each dummy data line intersects each gate line.

In one implementation of the second aspect, a width of each dummy data branch line is smaller than a width of each dummy data line.

In one implementation of the second aspect, widths of the plurality of dummy data branch lines are equal to each other.

In one implementation of the second aspect, each gate line is branched into a plurality of gate branch lines in an area in which each gate line intersects each dummy data line.

In one implementation of the second aspect, widths of the plurality of gate branch lines are different from each other.

In one implementation of the second aspect, a width of at least one gate branch line among the plurality of gate branch lines is smaller than a width of each gate line in the active area.

In one implementation of the second aspect, a width of at least one gate branch line among the plurality of gate branch lines is smaller than a width of each gate line in each dummy pixel area.

In one implementation of the second aspect, each pixel area includes a photo-sensitive pixel, wherein each photo-sensitive pixel includes a PIN (P-type/I-type/N-type semiconductors) diode, and a thin-film transistor electrically connected to the PIN diode.

In one implementation of the second aspect, the array substrate further comprises a readout circuitry and a gate driver disposed outside the active area, wherein the readout circuitry reads out a detection signal from each photo-sensitive pixel via each data line, wherein the gate driver supplies a scan signal to each photo-sensitive pixel via each gate line.

In one implementation of the second aspect, the width of each gate line gradually varies around a boundary line between the active area and each dummy pixel area.

A third aspect of the present disclosure provides a digital X-ray detector comprising: an array substrate for the digital X-ray detector; and a scintillator layer disposed on the array substrate to cover an active area thereof, wherein the array substrate for the digital X-ray detector includes: an active area including a plurality of pixel areas defined by intersections between a plurality of gate lines and a plurality of data lines arranged in a matrix form having a plurality of rows and a plurality of columns; and first and second dummy pixel areas, wherein the first dummy pixel area extends on and along one side of the active area, while the second dummy pixel area extends on and along the opposite side of the active area, wherein a first dummy gate line extends along the first dummy pixel area, and a second dummy gate line extends along the second dummy pixel area, wherein each data line extends across the active area, the first dummy pixel area, and the second dummy pixel area, wherein a width of each data line in each of the first and second dummy pixel areas is smaller than a width of each data line in the active area, wherein each dummy gate line may extend in a manner parallel to an extension direction of each gate line, wherein a width of each dummy gate line is smaller than a width of each gate line.

A fourth aspect of the present disclosure provides a digital X-ray detector comprising: an array substrate for the digital X-ray detector; and a scintillator layer disposed on the array substrate to cover an active area thereof, wherein the array substrate for the digital X-ray detector includes: an active area including a plurality of pixel areas defined by intersections between a plurality of gate lines and a plurality of data lines arranged in a matrix form having a plurality of rows and a plurality of columns; and first and second dummy pixel areas, wherein the first dummy pixel area extends on and along one side of the active area, while the second dummy pixel area extends on and along the opposite side of the active area, wherein a first dummy data line extends along the first dummy pixel area, and a second dummy data line extends along the second dummy pixel area, wherein each gate line extends across the active area and each dummy pixel area, wherein a width of each gate line in each dummy pixel area is smaller than a width of each gate line in the active area, wherein each dummy data line may extend in a manner parallel to an extension direction of each data line, wherein a width of each dummy data line is smaller than a width of each data line.

Although aspects of the present disclosure have been described in more detail with reference to the accompanying drawings, the present disclosure is not necessarily limited to these aspects. The present disclosure may be implemented in various modified manners within the scope not departing from the technical idea of the present disclosure. Accordingly, aspects disclosed in the present disclosure are not intended to limit the technical idea of the present disclosure, but to describe the present disclosure. The scope of the technical idea of the present disclosure is not limited by the aspects. Therefore, it should be understood that the aspects as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An array substrate for a digital X-ray detector, the array substrate comprising:
    an active area including a plurality of pixel areas defined by intersections between a plurality of gate lines and a plurality of data lines arranged in a matrix form having a plurality of rows and a plurality of columns; and
    first and second dummy pixel areas respectively including a first dummy gate line and a second dummy gate line, wherein the first dummy pixel area is extended on and along one side of the active area, and the second dummy pixel area is extended on and along an opposite side of the active area, wherein the first dummy gate line is extended along the first dummy pixel area, and the second dummy gate line is extended along the second dummy pixel area,
    wherein each data line is extended across the active area, the first dummy pixel area, and the second dummy pixel area,
    wherein a width of each data line in each of the first and second dummy pixel areas is smaller than a width of each data line in the active area,
    wherein a width of each dummy gate line is smaller than a width of each gate line, and
    wherein each of the plurality of pixel areas is the same as each of the first and second dummy pixel areas.

2. The array substrate of claim 1, wherein each dummy gate line is branched into a plurality of dummy gate branch lines in an area in which each dummy gate line intersects each data line.

3. The array substrate of claim 2, wherein a width of each dummy gate branch line is smaller than a width of each dummy gate line.

4. The array substrate of claim 2, wherein widths of the plurality of dummy gate branch lines are equal to each other.

5. The array substrate of claim 1, wherein each data line is branched into a plurality of data branch lines in an area in which each data line intersects each dummy gate line.

6. The array substrate of claim 5, wherein widths of the plurality of data branch lines are different from each other.

7. The array substrate of claim 6, wherein a width of at least one data branch line among the plurality of data branch lines is smaller than a width of each data line in the active area.

8. The array substrate of claim 6, wherein a width of at least one data branch line among the plurality of data branch lines is smaller than a width of each data line in each dummy pixel area.

9. The array substrate of claim 1, wherein each pixel area includes a photo-sensitive pixel, and
wherein each photo-sensitive pixel includes a PIN diode, and a thin-film transistor electrically connected to the PIN diode.

10. The array substrate of claim 9, wherein the array substrate further comprises a readout circuitry and a gate driver disposed outside the active area,
wherein the readout circuitry reads out a detection signal from each photo-sensitive pixel via each data line, and
wherein the gate driver supplies a scan signal to each photo-sensitive pixel via each gate line.

11. The array substrate of claim 1, wherein each dummy gate line is extended in a manner parallel to an extension direction of each gate line.

12. The array substrate of claim 1, wherein the width of each data line gradually varies around a boundary line between the active area and each dummy pixel area.

13. An array substrate for a digital X-ray detector, the array substrate comprising:
an active area including a plurality of pixel areas defined by intersections between a plurality of gate lines and a plurality of data lines arranged in a matrix form having a plurality of rows and a plurality of columns; and
first and second dummy pixel areas respectively including a first dummy gate line and a second dummy gate line, wherein the first dummy pixel area extends on and along one side of the active area, while the second dummy pixel area extends on and along the opposite side of the active area, wherein the first dummy data line extends along the first dummy pixel area, and the second dummy data line extends along the second dummy pixel area,
wherein each gate line extends across the active area and each dummy pixel area,
wherein a width of each gate line in each dummy pixel area is smaller than a width of each gate line in the active area, and
wherein a width of each dummy data line is smaller than a width of each data line, and
wherein each of the plurality of pixel areas is the same as each of the first and second dummy pixel areas.

14. The array substrate of claim 13, wherein each dummy data line is branched into a plurality of dummy data branch lines in an area in which each dummy data line intersects each gate line.

15. The array substrate of claim 14, wherein a width of each dummy data branch line is smaller than a width of each dummy data line.

16. The array substrate of claim 14, wherein widths of the plurality of dummy data branch lines are equal to each other.

17. The array substrate of claim 13, wherein each gate line is branched into a plurality of gate branch lines in an area in which each gate line intersects each dummy data line.

18. The array substrate of claim 17, wherein widths of the plurality of gate branch lines are different from each other.

19. The array substrate of claim 18, wherein a width of at least one gate branch line among the plurality of gate branch lines is smaller than a width of each gate line in the active area.

20. The array substrate of claim 18, wherein a width of at least one gate branch line among the plurality of gate branch lines is smaller than a width of each gate line in each dummy pixel area.

21. The array substrate of claim 13, wherein each pixel area includes a photo-sensitive pixel, and
wherein each photo-sensitive pixel includes a PIN diode, and a thin-film transistor electrically connected to the PIN diode.

22. The array substrate of claim 21, wherein the array substrate further comprises a readout circuitry and a gate driver disposed outside the active area,
wherein the readout circuitry reads out a detection signal from each photo-sensitive pixel via each data line, and
wherein the gate driver supplies a scan signal to each photo-sensitive pixel via each gate line.

23. The array substrate of claim 13, wherein each dummy data line extends in a manner parallel to an extension direction of each data line.

24. The array substrate of claim 13, wherein the width of each gate line gradually varies around a boundary line between the active area and each dummy pixel area.

25. A digital X-ray detector comprising:
an active area including a plurality of pixel areas defined by intersections between a plurality of gate lines and a plurality of data lines arranged in a matrix form having a plurality of rows and a plurality of columns; and
first and second dummy pixel areas respectively including a first dummy gate line and a second dummy gate line, wherein the first dummy pixel area is extended on and along one side of the active area, and the second dummy pixel area is extended on and along an opposite side of the active area, wherein the first dummy gate line is extended along the first dummy pixel area, and the second dummy gate line is extended along the second dummy pixel area,
wherein each data line is extended across the active area, the first dummy pixel area, and the second dummy pixel area,
wherein a width of each data line in each of the first and second dummy pixel areas is smaller than a width of each data line in the active area,
wherein a width of each dummy gate line is smaller than a width of each gate line; and
a scintillator layer disposed to cover an active area thereof,
wherein each of the plurality of pixel areas is the same as each of the first and second dummy pixel areas.

* * * * *